(12) United States Patent
Salatino et al.

(10) Patent No.: US 6,667,439 B2
(45) Date of Patent: Dec. 23, 2003

(54) INTEGRATED CIRCUIT PACKAGE INCLUDING OPENING EXPOSING PORTION OF AN IC

(75) Inventors: Matthew M. Salatino, Satellite Beach, FL (US); Patrick O. Weber, Mountain View, CA (US)

(73) Assignees: Authentec, Inc., Melbourne, FL (US); Hestia Technologies, Inc., Santa Clara, CA (US)

(*) Notice: Subject to any disclaimer, the term of this patent is extended or adjusted under 35 U.S.C. 154(b) by 30 days.

(21) Appl. No.: 09/931,378

(22) Filed: Aug. 16, 2001

(65) Prior Publication Data

US 2002/0088632 A1 Jul. 11, 2002

Related U.S. Application Data

(60) Provisional application No. 60/225,972, filed on Aug. 17, 2000.

(51) Int. Cl.⁷ .............................................. H01L 23/00
(52) U.S. Cl. .................... 174/52.1; 361/728; 361/752; 257/690; 257/787
(58) Field of Search ................... 174/52.1, 52.2, 174/52.3; 361/728, 736, 748, 752; 257/678, 690, 691, 701, 777, 778, 787

(56) References Cited

U.S. PATENT DOCUMENTS

| | | | |
|---|---|---|---|
| 5,264,393 A | 11/1993 | Tamura et al. | 437/209 |
| 5,424,249 A | 6/1995 | Ishibashi | 437/211 |
| 5,508,556 A * | 4/1996 | Lin | 257/691 |
| 5,570,272 A | 10/1996 | Variot | 361/723 |
| 5,622,873 A | 4/1997 | Kim et al. | 438/65 |
| 5,644,169 A | 7/1997 | Chun | 257/787 |
| 5,682,673 A | 11/1997 | Fehr | 29/827 |
| 5,687,474 A | 11/1997 | Hamzehdoost et al. | 29/832 |
| 5,811,799 A | 9/1998 | Wu | 250/239 |
| 5,862,248 A | 1/1999 | Salatino et al. | 382/124 |
| 5,927,505 A | 7/1999 | Chia et al. | 206/710 |
| 5,969,412 A * | 10/1999 | Matsutomo | 257/670 |
| 6,146,921 A | 11/2000 | Barrow | 438/122 |
| 6,177,723 B1 | 1/2001 | Eng et al. | 257/691 |
| 6,433,277 B1 * | 8/2002 | Glenn | 174/52.4 |

FOREIGN PATENT DOCUMENTS

EP 0724294 A2 7/1996 ......... H01L/23/495

OTHER PUBLICATIONS

Patent Abstracts of Japan, vol. 013, No. 366 (E–806), Aug. 15, 1989, JP01123447A (Sanken Electric Co Ltd, May 16, 1989).

* cited by examiner

Primary Examiner—Dean A. Reichard
Assistant Examiner—W. David Walkenhorst
(74) Attorney, Agent, or Firm—Allen, Dyer, Doppelt, Milbrath & Gilchrist, P.A.

(57) ABSTRACT

An IC package preferably includes an IC and encapsulating material surrounding the IC, with the encapsulating material having an opening therein to define an exposed portion of the IC. Vestigial portions of encapsulating material may be left on the exposed portion of the IC and spaced inwardly from a periphery of the opening based upon molding using a mold protrusion which includes a bleed-through retention channel positioned inwardly from peripheral edges. The channel collects and retains any bleed-through of the encapsulating material. The IC package may further include a leadframe carrying the IC. The leadframe may include a die pad, finger portions, and a plurality of die pad support bars. The die pad may be downset below a level of the finger portions. Each of the die pad support bars may be resiliently deformed to accommodate the downset of the die pad. Low stress encapsulating material and adhesive may also be included in the IC package.

58 Claims, 5 Drawing Sheets

INTEGRATED CIRCUIT PACKAGE INCLUDING OPENING EXPOSING PORTION OF AN IC

RELATED APPLICATION

This application is based upon U.S. provisional application serial No. 60/225,972 filed Aug. 17, 2000, the entire contents of which are incorporated herein by reference.

FIELD OF THE INVENTION

The present invention relates to the field of electronics, and, more particularly, to integrated circuit packages.

BACKGROUND OF THE INVENTION

Integrated circuit (IC) devices or packages are used in a wide variety of electronic applications including computers, cellular telephones, entertainment systems, etc. A typical IC package includes a chip of semiconductor material, or IC, in which active electronic devices are formed. Surrounding the IC is an encapsulating material, such as typically formed of a thermosetting or thermoplastic resin compound. To protect the IC from damage or contamination, the encapsulating material typically totally surrounds the IC.

The IC itself may be carried by a leadframe. The leadframe includes a die pad which carries the IC, finger portions which provide the electrical pins extending outwardly from the encapsulating material, and die pad support bars which extend from the die pad to the finger portions. Contact or bond pads on the surface of the IC are typically electrically connected to respective finger portions by bond wires which are surrounded by encapsulating material.

IC packaging has typically been concerned with protection and interconnects. Low cost, high volume manufacturing techniques are well established for conventional IC packaging. However, with the advent of various types of sensor, receiving, and/or transmitting circuits based on IC's, the need has arisen to expose some or most of the surface of the IC to the ambient environment. An example of such an IC device is an electric field fingerprint sensor, such as of the type described in U.S. Pat. No. 5,963,679 to Setlak and U.S. Pat. No. 5,862,248 to Salatino et al. Such sensors are available commercially from the assignee of these patents and the present invention, AuthenTec, Inc. of Melbourne, Fla.

The Salatino et al. patent, for example, discloses several approaches for molding the opening in the encapsulating material to expose the fingerprint sensing matrix. One approach uses a frame which holds a body of removable material in its interior and which is positioned on the IC before molding. After molding the body may be removed thereby producing the opening through the encapsulating material. In another embodiment, an upper mold includes a downward protruding portion which directly contacts the IC to exclude the encapsulating material from the surface of the IC during injection molding to thereby form the opening exposing the IC.

Somewhat similar, a number of other patents disclose forming an opening in the encapsulating material from beneath the IC. Accordingly, cooling media may be circulated in the opening, such as disclosed in U.S. Pat. No. 5,687,474 to Hamzehdoost et al. Similarly, U.S. Pat. No. 5,570,272 to Variot provides a heatsink body in the opening beneath the IC. A pressure sensor is disclosed in U.S. Pat. No. 5,424,249 to Ishibashi wherein the encapsulating material is first completely formed then an opening is cut therethrough to an underlying sensing diaphragm.

Methods for packaging IC's with an opening therein have generally been cumbersome and expensive, such as requiring specialized pre-made packaging and flexible or rigid printed circuit boards. These approaches are not well-suited to reliable, high volume, low cost manufacturing. Indeed, despite continuing significant developments, such as those described in the above noted Salatino et al. patent, a number of challenges are still presented for an IC package that exposes a portion of the IC. For example, it may be difficult to keep encapsulating material from bleeding under a mold protrusion that contacts the IC to form the opening. Preventing crush damage to the IC from foreign particles pressed between the mold and the IC also remains a challenge. Variations in the thicknesses of the IC's, adhesive layers, leadframes, etc. as well as accommodating IC skew also remains an area of concern.

SUMMARY OF THE INVENTION

In view of the foregoing background, it is therefore an object of the invention to provide an integrated circuit package comprising an IC and encapsulating material surrounding the IC, but leaving an exposed portion, and wherein the IC package is readily manufactured.

This and other objects, features, and advantages in accordance with the present invention are provided by an integrated circuit package comprising an IC and encapsulating material surrounding the IC, with the encapsulating material having an opening therein to define an exposed portion of the IC. In one class of embodiments, in view of the manufacturing approach, vestigial portions of encapsulating material are left on the exposed portion of the IC and spaced inwardly from a periphery of the opening in the encapsulating material. This is a result of a manufacturing process using a mold protrusion to form the opening. The mold protrusion may include a bleed-through retention channel positioned inwardly from the peripheral edges of an IC-contact surface. The bleed-through retention channel collects and retains any bleed-through of the encapsulating material and prevents its spread further inwardly onto the exposed surface of the IC.

The opening in the encapsulating material may be generally rectangular. Accordingly, the vestigial portions of encapsulating material may be arranged along at least one side of an imaginary rectangle spaced inwardly from the generally rectangular opening in the encapsulating material.

In some embodiments, the IC package may further include a leadframe carrying the IC. More particularly, the leadframe may comprise a die pad, finger portions, and a plurality of die pad support bars extending between the die pad and the finger portions at the corners. The die pad may be downset below a level of the finger portions. In addition, each of the die pad support bars may be resilient deformed to accommodate the downset of the die pad.

The package may further include bond wires extending between the IC and the finger portions. These bond wires may have a desired clearance from adjacent portions of the IC and an upper surface of the encapsulating material when the die pad is downset. In other words, shaping of the bond wires is performed to account for the downset imparted during manufacturing.

To reduce stress during cooling, the die pad may have an opening therein. Further, a low stress, low modulus adhesive may be used to secure the IC to the die pad. The encapsulating material may also be a low stress encapsulating material.

In other embodiments, the IC package may include a substrate on a back surface of the IC opposite the exposed portion. This substrate may cover the back surface so that the encapsulating material does not extend onto the back surface. In slightly different terms, the substrate, such as a printed circuit board, provides protection for the back surface of the IC and becomes part of the package.

The IC may include upper surface portions with active devices formed therein. The exposed portion of the IC may comprise these upper surface portions. In some advantageous embodiments, the active devices may define a sensor, such as an electric field fingerprint sensor, for example. Other devices may be similarly packaged.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
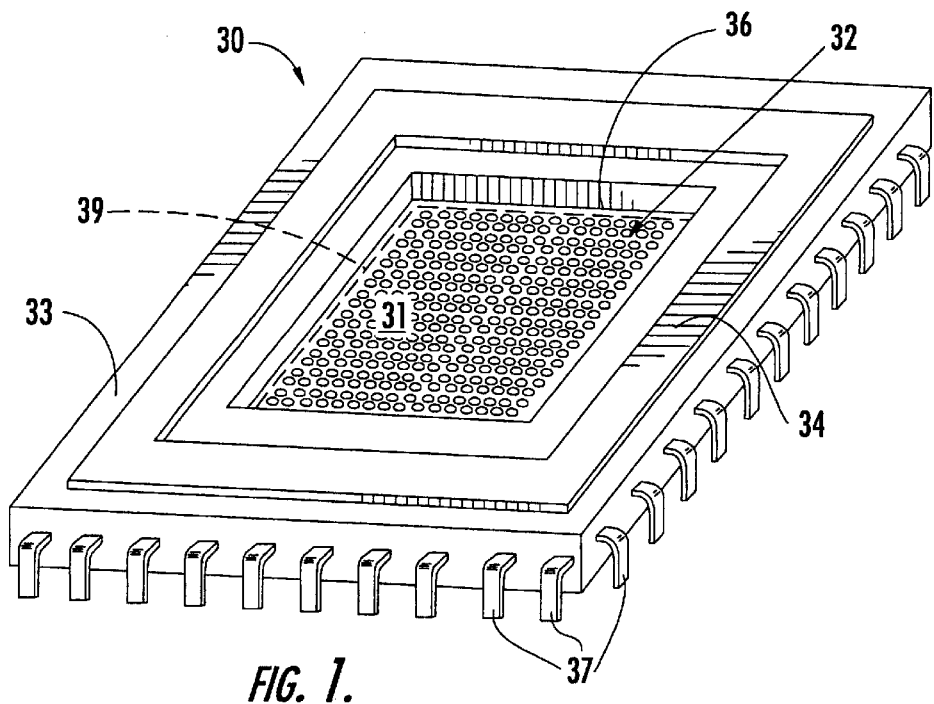
FIG. 1 is a perspective view of an exemplary fingerprint sensor IC package in accordance with the present invention.
Figure 2:
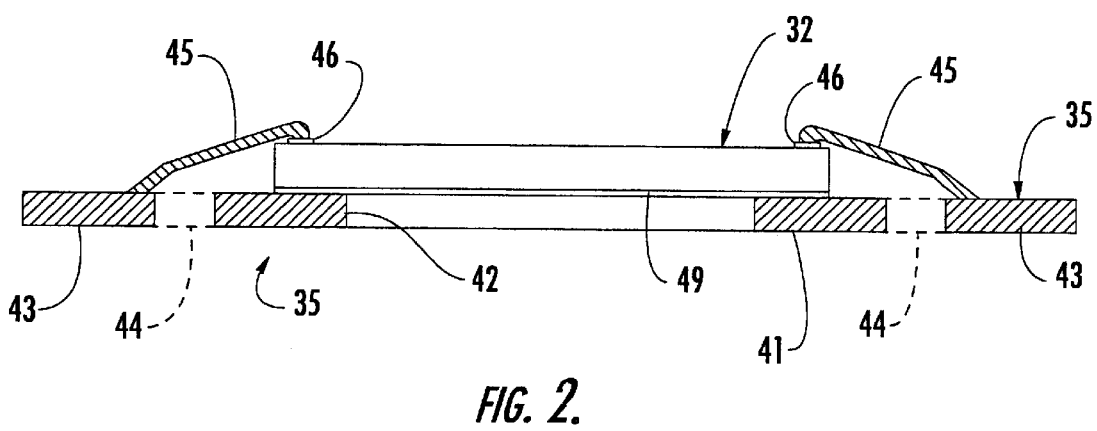
FIG. 2 is a schematic cross-sectional view of the IC package as shown in FIG. 1 during manufacture.
Figure 3:
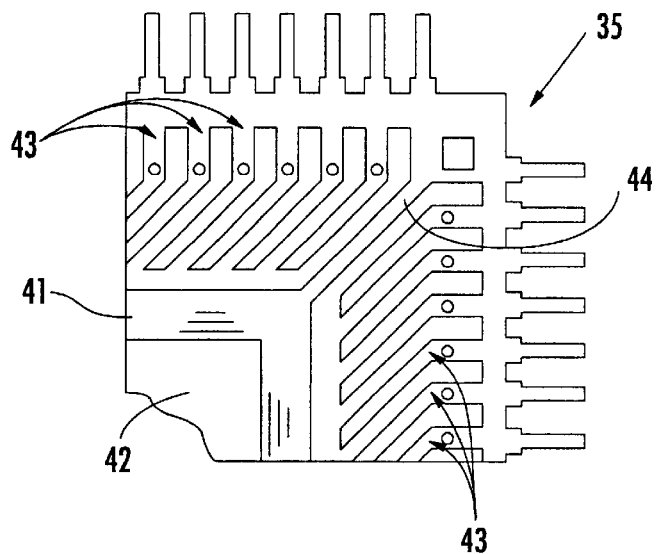
FIG. 3 is an enlarged plan view of a portion of the leadframe as shown in FIG. 2.

For clarity of explanation, the present invention is explained with reference to manufacturing methods for making an IC package 30 in the illustrated form of an electric field fingerprint sensor IC package as shown in FIG. 1. The electric field fingerprint sensor IC package 30 may of the type using an electric field to sense the ridges and valleys of a fingerprint as offered by AuthenTec, Inc. of Melbourne, Fla. under the designation FingerLoc™ AF-S2™.

The IC package 30 illustratively corresponds to a JEDEC-standard 68-pin plastic leaded chip carrier (PLCC) format, although other sizes, standards, and configurations are possible. The IC package 30 may be about 24 mm square, and have a height or thickness of about 3.5 mm, for example. Another exemplary package may be a 144 lead LQFP about 1.6 mm thick.

Further details on the operation of the electric field fingerprint sensor may be found in U.S. Pat. Nos. 5,963,679 and 5,862,248 mentioned above, and, the entire disclosures of which are incorporated herein by reference. Of course, other sensors and other devices are also contemplated by the present invention.

The IC package 30 illustratively includes an IC chip or die 32 illustratively including an IC sensor matrix 31 which is exposed through an opening 36 in the upper portion of the encapsulating material 33. Vestigial portions of encapsulating material may remain on the exposed portion of the IC 32, outside the area of the sensor matrix 31. These vestigial portions 39 are schematically indicated in FIG. 1 by the dashed line rectangle and these vestigial portions are described in greater detail below.

The IC package 30 also includes a leadframe on which the IC 32 is mounted as will be described in greater detail below. The leadframe includes a plurality of finger portions which become the visible leads or pins 37 which also extend outwardly from the sides of the encapsulating material 33 as will be appreciated by those of skill in the art. An annular drive ring 34 is provided on the upper surface of the encapsulating material 33 adjacent the opening 36 exposing the sensing matrix 31. This drive ring 34 is specific to the illustrated electric field fingerprint sensor and is not needed in all such embodiments, or in other IC packages.

For ease of explanation, the term "IC" by itself is used primarily herein for simplicity to denote the actual integrated circuit die as will be appreciated by those of skill in the art. Also for ease of explanation, the term "IC package" is used to indicate the IC 32, surrounding encapsulating material 33, leadframe 35, etc. as an entity.

Figure 7:
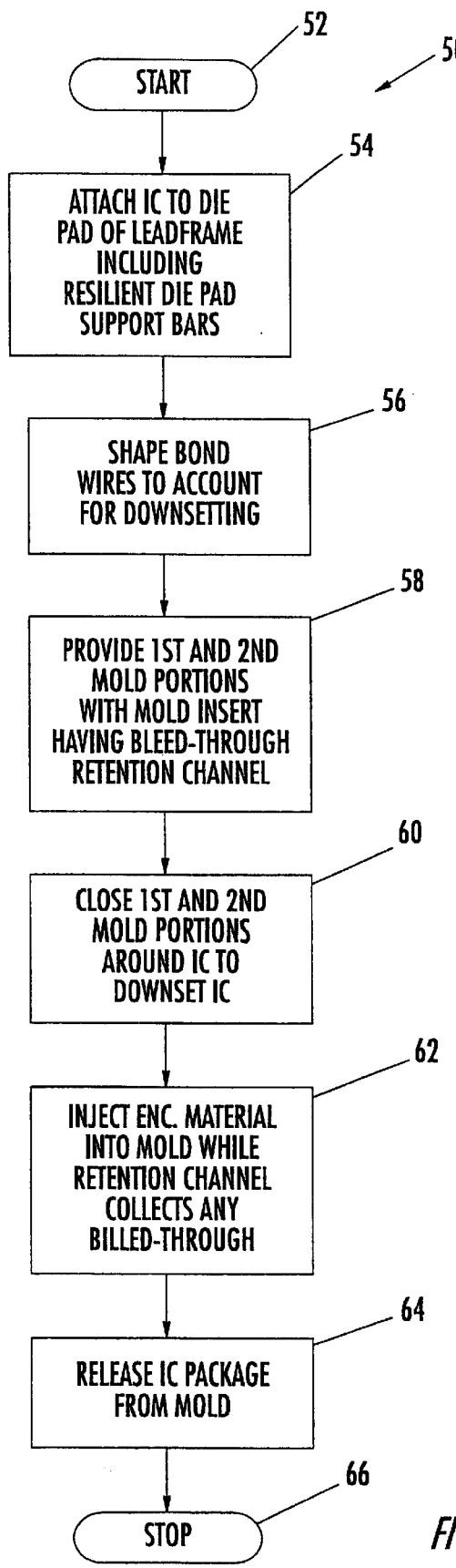
FIG. 7 is a flowchart of the method for manufacturing the IC package as shown in FIG. 1.

Referring now additionally to the flowchart 50 of FIG. 7, and the schematic diagrams of FIGS. 2 through 5, further details of the manufacturing method and IC package 30 produced thereby are now described. From the start (Block 52), an IC 32 is attached to a die pad 41 of the leadframe 35 at Block 54. More particularly, as perhaps best understood with reference to FIGS. 2 and 3, the leadframe 35 includes a die pad 41 and finger portions 43 which are connected together at each corner by a respective resilient die pad support bar 44. As will be appreciated by those skilled in the art, the finger portions 43 are later processed to form the visible leads 37 extending outwardly from the encapsulating material 33 as shown in FIG. 1.

The die pad 41 of the leadframe 35 also illustratively has a central opening 42 therein. This opening 24 reduces stress during cooling of the encapsulating material 33 as will be described in greater detail below. A low stress, low modulus adhesive 49 may also be used to adhesively secure the IC 32 to the die pad 41 as will also be described in greater detail below.

At Block 56 the bond wires 45, which extend between respective finger portions 43 and bond pads 46 of the IC 32, are shaped to account for later downsetting. As shown best in FIGS. 2 and 4, the bond wires 45 are initially shaped so as to be angled downwardly at their upper ends. These upper ends will extend generally horizontally upon downsetting as shown best in FIGS. 5 and 6.

Figure 4:
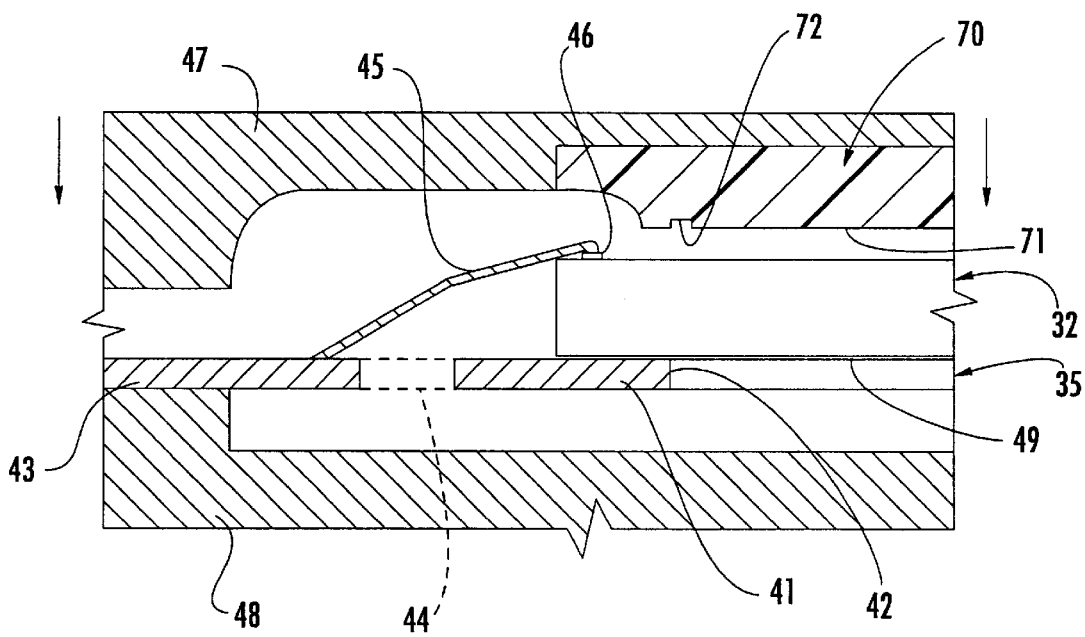
FIGS. 4 and 5 are schematic partial side cross-sectional views during manufacture of the IC package as shown in FIG. 1.

At Block 58 a mold is provided having first and second, or upper and lower mold portions 47, 48 as shown in FIG. 4. The first or upper mold portion 47 preferably carries a mold protrusion 70 defining an IC-contact surface 71 with peripheral edges and a bleed-through retention channel 72 positioned inwardly from the peripheral edges.

Figure 5:
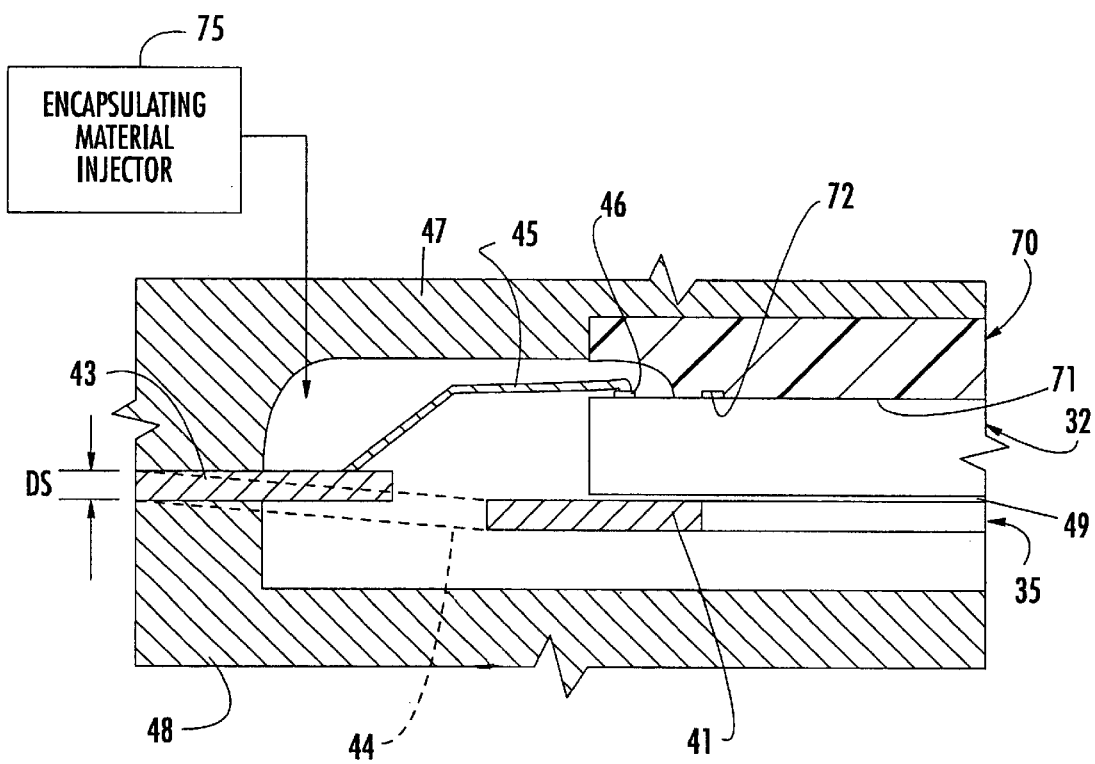

At Block 60 the upper and lower mold portions 47, 48 are closed around the IC 32. As shown in the illustrated embodiment, the IC-contact surface 71 contacts and presses directly upon the upper surface of the IC 32 and causes the IC to be downset a distance DS as shown in FIG. 5. In other words, the resilient die pad support bars 44 permit the IC 32 to be contacted and moved downwardly to the position as shown in FIG. 5 so that the die pad 41 is displaced below the finger portions 43. Accordingly, a close fit is provided between the IC 32 and contact surface 71 to prevent encapsulating material from bleeding extensively beneath the mold protrusion 70 and onto the surface of the IC 32, and without crushing the IC.

The downsetting also accommodates skew of the IC surface and variations in thickness of the IC 32, adhesive layer 49, and/or portions of the leadframe 35 as will be readily appreciated by those skilled in the art. Considered in somewhat different terms, the manufacturing method includes controlling pressure applied by the IC-contact surface 71 to the IC 32 when the first and second mold portions 47, 48 are closed around the IC. This may be done as shown in the illustrated embodiment by mounting the IC 32 on the leadframe 35 having resilient portions to resiliently accommodate downsetting of the IC as the IC-contact surface 71 contacts the IC. The resilient die pad support bars 44 as shown in the illustrated embodiment, for example, maintain a desired pressure placed on the IC 32 by the contact surface 71 of the mold protrusion 70 when the mold is closed. The die pad support bars 44 are placed in tension by the downsetting to provide a spring-like force or pressure to IC 32 against the contact surface 71 of the mold protrusion 70. This pressure is controlled to avoid risk of damage while reducing likelihood of bleed-through of the encapsulating material 33 beneath the contact surface 71 as will be appreciated by those skilled in the art. Considered yet in other terms, the die pad 41 is essentially allowed to float during the molding process. The die pad support bars 44 can readily accommodate tolerance variations of several thousandths of an inch and produce high quality IC packages.

The downsetting also aligns the bond wires 45 in a proper position to provide clearance from adjacent portions of the IC 32 as well as to provide clearance from the adjacent upper surface portions of the encapsulating material 33. Accordingly shorts from contact with the IC 32, or bond wires 45 being exposed through the encapsulating material 33 are avoided. As shown in the illustrated embodiment of FIG. 5, the bond wires 45 in the completed position after downsetting may have upper portions which extend generally horizontally away from the IC 32 before turning downward toward the finger portions 43 of the leadframe 35.

At Block 62 the encapsulating material 33 is injected into the mold from the schematically illustrated injector 75 under controlled pressure. Those of skill in the art will appreciate detailed construction and operation of the encapsulating material injector 33 without further discussion herein.

Figure 6:
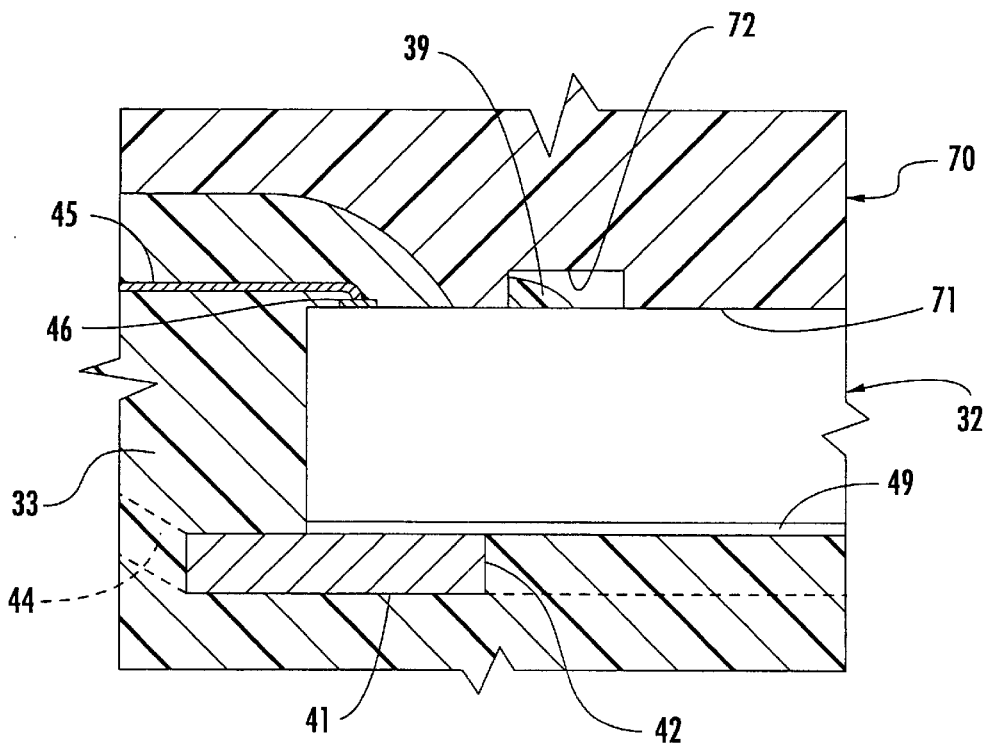
FIG. 6 is a greatly enlarged schematic partial side cross-sectional view of the IC package during manufacture thereof after encapsulating material has been injected into the mold.

As can be seen perhaps best in FIG. 6, a small bead or line of encapsulating material 33 may bleed under the peripheral edges of the mold protrusion 70 and remain as a vestigial portion 39 of the encapsulating material on the exposed surface of the IC 32. As will be appreciated by those skilled in the art the relative size of the vestigial portions 39 is greatly exaggerated for clarity of illustration. In short, the bleed-through retention channel 72 retains any encapsulating material bleeding beneath the peripheral edges of the IC contact surface 71.

It has been found that a flat contact surface of a mold protrusion alone is not likely to reliably prevent the encapsulating material 33 from wicking along the interface between the contact surface 71 and the IC 32. It is also likely that typical mold clamping pressures cannot be exerted on the IC 32 without considerable risk of damage. Because the clamping pressure is typically lowered, the potential for bleed-through or wicking of the encapsulating material becomes more important. Accordingly, the bleed-through retention channel 72 may be considered as providing a moat to act as a natural break for the bleeding of the encapsulating material 33 during molding.

The mold protrusion 70 may comprise a resilient material, and have a generally rectangular shape having a side dimension of about 5 to 20 mm for an IC package 30 having a side dimension of about 25 mm, for example. The bleed-through retention channel 72 may be spaced inwardly from the peripheral edges a distance of about 0.2 to 0.4 mm, for example. The retention channel 72 may also have a width of about 1 mm, and a height of about 0.15 to 0.25 mm. Those of skill in the art will appreciate that other sizes are also contemplated by the present invention depending on the application and the size of the IC package.

The IC package 30, that is, the IC 32, leadframe 35, and encapsulating material 33 may be released from the mold at Block 64 before stopping at Block 66. Those of skill in the art will appreciate that other finishing steps, including trimming excess encapsulating material, and separating the finger portions, for example, are also typically performed to produce the finished IC package 30.

Another aspect of the manufacturing relates to stress relief. Stress relief may be important since the encapsulating material 33 and the IC 32 typically have different coefficients of thermal expansion (CTEs). It is noted that the leadframe 35 may also have a different CTE. Accordingly, the manufacturing method preferably includes relieving stress during cooling of the encapsulating material 33 despite the different CTEs. The IC package 30 will have an unbalance of thermal-mechanical stress because of the opening 36. This is in contrast to the balanced stress which results in a balanced compressive force experienced by an IC in a typical fully encapsulated IC.

For example, relieving the stress may comprise using a low stress encapsulating material 33. For example, the encapsulating material 33 may be a mold compound sold under the designation Plaskon SMT-B1-LV by Cookson Semiconductor Packaging Materials of Alpharetta, Ga. Those of skill in the art will appreciate that other similar mold compounds may be used as well. Alternately or additionally, stress relief may be provided by using a leadframe 35, such as illustrated and described herein, which includes the die pad 41 with the opening 42 therein. The IC 32 may also be mounted on the die pad 41 using a low stress, low modulus adhesive 49. For example, the die attach adhesive 49 may be an adhesive sold under the designation Ablebond 8340, and manufactured by Ablestick Electronics Materials and Adhesives (National Starch and Chemical Co.) of Rancho Dominguez, Calif. The low stress, low modulus adhesive 49 and/or open die pad 41 tends to decouple the IC 32 from the leadframe 35 which may typically comprise copper.

As described herein, the IC 32 may have an upper surface with active devices formed therein, such as the illustrated fingerprint sensor with the pixel element matrix 31. Of course, those of skill in the art will appreciate that the techniques described herein could also be used to expose the back or underside of an IC.

The first and second mold portions 47, 48 may each comprise a rigid material, such as hardened steel, to provide accurate dimensions and to resist abrasion from the encapsulating material 33. Although the molding process is relatively clean, small particles may be left on the top of the IC 32 or on the contact surface 71 of the mold protrusion 70 as will be readily appreciated by those skilled in the art. In contrast to the mold portions 47, 48, the mold protrusion 70 may comprise a compliant or resilient material so that any contaminants are not forced into the IC 32 causing damage. The material properties of the mold protrusion 70 are desirably such that any small particles will be pressed into the contact surface 71 instead of into the IC 32. However, it is still desired that the mold protrusion 70 retain its shape through the molding process. The mold tooling is also preferably such as to permit removal of the mold protrusion 70 for cleaning and/or replacement if worn or damaged as will also be appreciated by those skilled in the art.

One attribute of the molding process is that the mold will acquire a build-up of encapsulating material and wax material that may produce aesthetic problems in the finished IC package. Accordingly, mold cleaning is typically performed at periodic intervals. A conventional mold cleaning process entails molding a plastic gettering material, such as melamine, that will adhere to any organic material. After a few molding cycles using the gettering material, normal production is continued. The melamine has a high adhesion to organic particles, but low adhesion to hardened steel mold surfaces.

The mold protrusion 70 can be made of any of a number of appropriate materials. If the mold protrusion 70 is formed of an organic polymer, precautions may be needed to clean the mold, as the conventional melamine cleaning process could potentially damage the compliant mold protrusion by sticking to it and pulling it apart. Several approaches may be used to alleviate this potential difficulty. The organic polymer mold protrusion 70 can be temporarily replaced with a corresponding metal insert during melamine cleaning, for example. A metal or non-stick cap or non-stick coating could be provided over the organic polymer mold protrusion 70.

Returning again to FIGS. 1 through 6, it can be appreciated that the IC package 30 produced using the advantageous processes described herein will have certain distinguishing features and characteristics. For example, in one class of embodiments, in view of the manufacturing approach, vestigial portions 39 of encapsulating material 33 are left on the exposed portion 31 of the IC 32 and spaced inwardly from a periphery of the opening 36 in the encapsulating material. Of course, these vestigial portions 39 could be removed in some embodiments if desired, but simpler and less expensive manufacturing is obtained if the vestigial portions do not effect IC operation and are, therefore, allowed to remain on the IC 32.

As described herein, the opening 36 in the encapsulating material 33 may be generally rectangular. For these embodiments the vestigial portions 39 of encapsulating material are arranged along an imaginary rectangle spaced inwardly from the generally rectangular opening in the encapsulating material. It should be noted that the vestigial portions 39 need not necessarily be connected to form a complete rectangle, rather, the vestigial portions may be spaced, but lie along an imaginary rectangle as defined by the bleed-through retention channel 72 of the mold protrusion 70. For example, the vestigial portions may be spaced inwardly a distance of from 0.1 to 3 mm for an IC package having side dimensions of about 25 mm. Of course, the same principles can be readily applied to other polygonal, round, or other closed geometric shapes as will be appreciated by those skilled in the art.

Another characteristic of the IC package 30 resulting from manufacture as described herein is the downset relationship of the die pad 41 relative to the finger portions 43. The die pad support bars 44 may also be resiliently deformed to accommodate the downset of the die pad 41. In addition, the bond wires 45 will also likely have a desired clearance from adjacent portions of the IC 32 and an upper surface of the encapsulating material 33 when the die pad 41 is downset.

As also described herein, to reduce stress during cooling, the die pad 41 (FIG. 3) may have an opening 42 therein. Further, a low stress, low modulus adhesive 49 may be used to secure the IC to the die pad 41. The encapsulating material 33 may also be a low stress encapsulating material.

The IC 32 may include upper surface portions with active devices formed therein, such as fingerprint sensing circuitry. The exposed portion of the IC may comprise these upper surface portions. In some advantageous embodiments, the active devices may define a sensor, such as an electric field fingerprint sensor, for example. Other devices may be similarly packaged as will be also readily understood by those skilled in the art.

Figure 8:
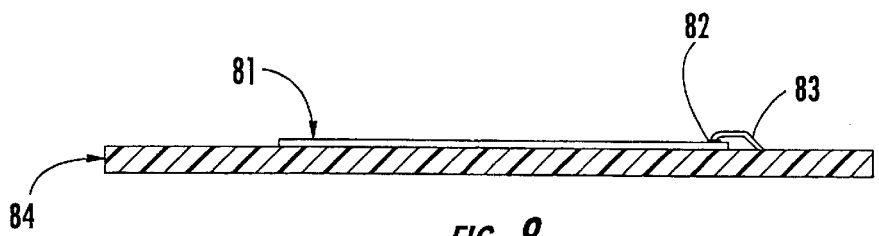
FIGS. 8 and 9 are schematic cross-sectional views of another embodiment of an IC package during manufacturing thereof.
Figure 9:
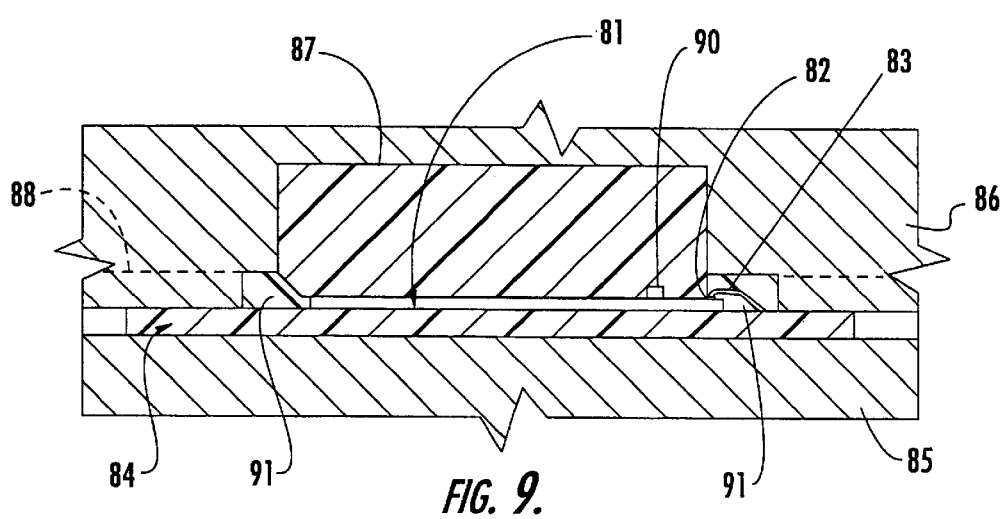
Figure 10:
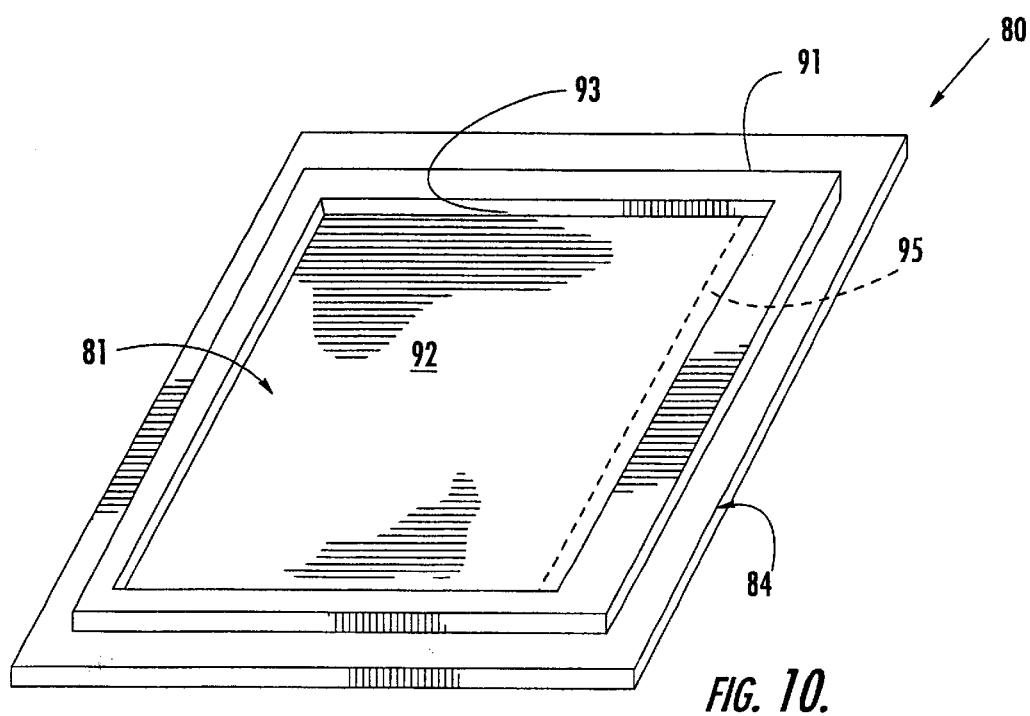
FIG. 10 is a perspective view of the IC package as shown in FIGS. 8 and 9 upon completion.

Turning now additionally to FIGS. 8–10, another embodiment of an IC package 80 and its method of manufacture are now described. As shown in FIG. 8, the IC 81 is adhesively secured to a substrate 84, which may be a printed circuit board, for example. For clarity of explanation, the layer of adhesive is not shown, but may be of the type described above, for example. The substrate 84 may be rigid in some embodiments, but can also be flexible in other embodiments. The substrate 84 may be a ball grid array substrate, or be of the type that with further processing will become a ball grid array substrate. Other substrate types are also contemplated by the invention. In other words, in this IC package 80 the leadframe 35 for mounting the IC and described extensively above is replaced with the substrate 84.

In the illustrated embodiment, the bond pads 82 are also along only one side of the IC 81, and, accordingly, the bond wires 83 are also along only one side of the IC 81. Those of skill in the art will recognize that in other embodiments, the bond pads 82 could be along two, three or all four sides in other embodiments.

The IC 81 and substrate 84 are placed between a lower mold portion 85 and an upper mold portion 86 as shown in FIG. 9, and encapsulating material 91 is injected under controlled pressure. A mold protrusion 87 is provided adjacent the upper mold portion 86. The mold protrusion 87 is desirably relatively compliant so as not to crush foreign particles into the IC 81. Further, in this embodiment, since downsetting of a leadframe 35 is not used to accommodate variations in thicknesses, the compliancy of the mold protrusion 87 accommodates any variations, such as in the thickness of the substrate 84, adhesive layer and/or IC 81. In one example, the mold protrusion 87 may comprise a solid body of Teflon, for example. As will be seen below, because there is no encapsulating material 91 injected under pressure beneath the IC 81, a more compliant mold protrusion 87 may be used than compared, for example, to the embodiments described above using the leadframe 35.

The upper mold portion 86 may be provided as two portions which mate at the illustrated dashed line 88. In other words the upper mold portion 86 may include a changeable cavity plate at the level of the dashed line 88 so that this plate may be changed to accommodate different sized packages as will be appreciated by those skilled in the art.

In this illustrated embodiment, it is further noted that the bleed-through retention channel 90 in the mold protrusion 87 is only along the right hand side of the IC 81. This is so because the encapsulating material 91 will extend onto the upper surface of the IC 81 to cover the bond pads 82 and bond wires 83 on the right hand side. On the lefthand side it can be seen that the encapsulating material 91 does not extend onto the upper surface, and bleed through of the encapsulating material can be controlled since the mold protrusion 87 extends completely over the upper surface and slightly beyond. Those of skill in the art will appreciate that in other embodiments, the mold protrusion 87 could also be made or configured to have the bleed-through retention channel 90 extend on two, three or all four sides.

The finished IC package 80 is shown in FIG. 10 wherein an upper surface 92 of the IC 81 is exposed through the opening 93 in the encapsulating material 91. In this illustrated embodiment, the substrate 84 extends outwardly beyond the side edges of the IC 81. In other embodiments, the side edges of the substrate 84 may be terminated flush with the side edges of the IC 81 as will be appreciated by those skilled in the art. The vestigial portions 95 of encapsulating material 91 are also schematically illustrated by the dashed line on the right hand side of the upper surface 92 of the IC 81.

It is further noted that although the encapsulating material 91 surrounds the IC 81, there is no encapsulating material 91 on the back surface of the IC in the illustrated IC package 80. In this embodiment, the substrate 84 provides the protection for the back surface.

Other aspects of the invention are disclosed in U.S. Patent Application Ser. No. 09/931,587, entitled "METHODS AND APPARATUS FOR MAKING INTEGRATED CIRCUIT PACKAGE INCLUDING OPENING EXPOSING PORTION OF THE IC" file concurrently herewith. The entire contents of this application are incorporated herein by reference. In addition, many modifications and other embodiments of the invention will come to the mind of one skilled in the art having the benefit of the teachings presented in the foregoing descriptions and the associated drawings. Accordingly, it is understood that the invention is not to be limited to the illustrated embodiments disclosed, and that other modifications and embodiments are intended to be included within the spirit and scope of the appended claims.

That which is claimed is:

1. An integrated circuit package comprising:
   an integrated circuit (IC) and encapsulating material surrounding said IC,
   said encapsulating material having an opening therein to define an exposed portion of said IC; and
   vestigial portions of said encapsulating material on the exposed portion of said IC an spaced inwardly from a periphery of the opening in maid ecapsulating material.

2. An integrated circuit package according to claim 1 wherein the opening in said encapsulating material is generally rectangular; and wherein said vestigial portions of encapsulating material are arranged along at least one side of an imaginary rectangle spaced inwardly from the generally rectangular opening in said encapsulating material.

3. An integrated circuit package according to claim 1 wherein said vestigial portions are spaced inwardly a distance of from 0.1 to 3 mm.

4. An integrated circuit package according to claim 1 further comprising a leadframe carrying said IC.

5. An integrated circuit package according to claim 4 wherein said leadframe comprises a die pad, finger portions, and a plurality of die pad support bars extending between said die pad and said finger portions.

6. An integrated circuit package according to claim 5 wherein said die pad is downset below a level of said finger portions.

7. An integrated circuit package according to claim 6 wherein each of said die pad support bars is resiliently deformed to accommodate the downset of said die pad.

8. An integrated circuit package according to claim 6 further comprising bond wires extending between said IC and the finger portion having a desired clearance from adjacent portions of said IC and an upper surface of said encapsulating material.

9. An integrated circuit package according to claim 5 wherein said die pad has an opening therein.

10. An integrated circuit package according to claim 5 further comprising a low stress, low modulus adhesive securing said IC to said die pad.

11. An integrated circuit package according to claim 1 further comprising a substrate adjacent a back surface of said IC opposite the exposed portion.

12. An integrated circuit package according to claim 1 wherein said substrate covers the back surface of said IC so that said encapsulating material does not extend onto the back surface.

13. An integrated circuit package according to claim 1 wherein said encapsulating material comprises a low stress encapsulating material.

14. An integrated circuit package according to claim 1 wherein said IC comprises upper surface portions with active devices formed therein; and wherein the exposed portion of said IC comprises upper surface portions thereof.

15. An integrated circuit package according to claim 14 wherein the active devices define a sensor.

16. An integrated circuit package according to claim 14 wherein the active devices define an electric field fingerprint sensor.

17. An integrated circuit package comprising:
   an integrated circuit (IC) comprising upper surface portions with active devices formed therein and encapsulating material surrounding said IC;
   said encapsulating material having an opening therein adjacent the upper surface portions of said IC to define an exposed portion of said IC; and
   a leadframe comprising a die pad carrying said IC, finger portions, and a plurality of die pad support bars extending between said die pad and said finger portions;
   said die pad being downset below a level of said finger portions.

18. An integrated circuit package according to claim 17 wherein each of said die pad support bars is resiliently deformed to accommodate the downset of said die pad.

19. An integrated circuit package according to claim 18 further comprising bond wires extending between said IC and the finger portion having a desired clearance from adjacent portions of said IC and an upper surface of said encapsulating material.

20. An integrated circuit package according to claim 17 wherein said die pad has an opening therein.

21. An integrated circuit package according to claim 20 further comprising a low stress, low modulus adhesive securing said IC to said die pad.

22. An integrated circuit package according to claim 17 wherein said encapsulating material comprises a low stress encapsulating material.

23. An integrated circuit package according to claim 17 further comprising vestigial portions of encapsulating material on the exposed portion of said IC and spaced inwardly from a periphery of the opening in said encapsulating material.

24. An integrated circuit package according to claim 23 wherein the opening in said encapsulating material is generally rectangular; and wherein said vestigial portions of encapsulating material are arranged along an imaginary rectangle spaced inwardly from the generally rectangular opening in said encapsulating material.

25. An integrated circuit package according to claim 23 wherein said vestigial portions are spaced inwardly a distance of from 0.1 to 3 mm.

26. An integrated circuit package according to claim 17 wherein the active devices define a sensor.

27. An integrated circuit package according to claim 17 wherein the active devices define an electric field fingerprint sensor.

28. An integrated circuit package comprising:

an integrated circuit (IC) comprising upper surface portions with active devices formed therein and encapsulating material surrounding said IC;

said encapsulating material having an opening therein adjacent the upper surface portions of said IC to define an exposed portion of said IC; and a leadframe comprising a die pad carrying said IC, finger portions, and a plurality of die pad support bars extending between said die pad and said finger portions, each of said die pad support bars being resiliently deformed.

29. An integrated circuit package according to claim 28 wherein said die pad is downset below a level of said finger portions.

30. An integrated circuit package according to claim 29 further comprising bond wires extending between said IC and the finger portion having a desired clearance from adjacent portions of said IC and an upper surface of said encapsulating material.

31. An integrated circuit package according to claim 28 wherein said die pad has an opening therein.

32. An integrated circuit package according to claim 31 further comprising a low stress, low modulus adhesive securing said IC to said die pad.

33. An integrated circuit package according to claim 28 wherein said encapsulating material comprises a low stress encapsulating material.

34. An integrated circuit package according to claim 28 further comprising vestigial portions of encapsulating material on the exposed portion of said IC and spaced inwardly from a periphery of the opening in said encapsulating material.

35. An integrated circuit package according to claim 34 wherein the opening in said encapsulating material is generally rectangular; and wherein said vestigial portions of encapsulating material are arranged along an imaginary rectangle spaced inwardly from the generally rectangular opening in said encapsulating material.

36. An integrated circuit package according to claim 34 wherein said vestigial portions are spaced inwardly a distance of from 0.1 to 3 mm.

37. An integrated circuit package according to claim 28 wherein the active devices define a sensor.

38. An integrated circuit package according to claim 28 wherein the active devices define an electric field fingerprint sensor.

39. An integrated circuit package comprising:

an integrated circuit (IC) comprising upper surface portions with active devices formed therein and encapsulating material surrounding said IC;

said encapsulating material having an opening therein adjacent the upper surface portions of said IC to define an exposed portion of said IC; and a die pad carrying said IC, said die pad having an opening therein.

40. An integrated circuit package according to claim 39 further comprising finger portions, and a plurality of die pad support bars extending between said die pad and said finger portions, and wherein said die pad is downset below a level of said finger portions.

41. An integrated circuit package according to claim 40 wherein each of said die pad support bars is resilient deformed to accommodate the downset of said die pad.

42. An integrated circuit package according to claim 40 further comprising bond wires extending between said IC and the finger portion having a desired clearance from adjacent portions of said IC and an upper surface of said encapsulating material.

43. An integrated circuit package according to claim 39 further comprising a low stress, low modulus adhesive securing said IC to said die pad.

44. An integrated circuit package according to claim 39 wherein said encapsulating material comprises a low stress encapsulating material.

45. An integrated circuit package according to claim 39 further comprising vestigial portions of encapsulating material on the exposed portion of said IC and spaced inwardly from a periphery of the opening in said encapsulating material.

46. An integrated circuit package according to claim 45 wherein the opening in said encapsulating material is generally rectangular; and wherein said vestigial portions of encapsulating material are arranged along an imaginary rectangle spaced inwardly from the generally rectangular opening in said encapsulating material.

47. An integrated circuit package according to claim 45 wherein said vestigial portions are spaced inwardly a distance of from 0.1 to 3 mm.

48. An integrated circuit package according to claim 39 wherein the active devices define a sensor.

49. An integrated circuit package according to claim 39 wherein the active devices define an electric field fingerprint sensor.

50. An integrated circuit package comprising:

an integrated circuit (IC) and encapsulating material surrounding said IC;

said encapsulating material having an opening therein to define an exposed portion of said IC; and a substrate covering a back surface of said IC opposite the exposed portion so that said encapsulating material does not extend onto the back surface of said IC.

51. An integrated circuit package according to claim 50 wherein said substrate comprises a printed circuit board.

52. An integrated circuit package according to claim 50 further vestigial portions of encapsulating material on the exposed portion of said IC and spaced inwardly from a periphery of the opening in said encapsulating material.

53. An integrated circuit package according to claim 52 wherein the opening in said encapsulating material is generally rectangular; and wherein said vestigial portions of encapsulating material are arranged along at least one side of an imaginary rectangle spaced inwardly from the generally rectangular opening in said encapsulating material.

54. An integrated circuit package according to claim 52 wherein said vestigial portions are spaced inwardly a distance of from 0.1 to 3 mm.

55. An integrated circuit package according to claim 52 wherein said encapsulating material comprises a low stress encapsulating material.

56. An integrated circuit package according to claim 52 wherein said IC comprises upper surface portions with active devices formed therein; and wherein the exposed portion of said IC comprises upper surface portions thereof.

57. An integrated circuit package according to claim 56 wherein the active devices define a sensor.

58. An integrated circuit package according to claim 57 wherein the active devices define an electric field fingerprint sensor.

* * * * *

UNITED STATES PATENT AND TRADEMARK OFFICE
CERTIFICATE OF CORRECTION

PATENT NO. : 6,667,439 B2
APPLICATION NO. : 09/931378
DATED : December 23, 2003
INVENTOR(S) : Salatino et al.

It is certified that error appears in the above-identified patent and that said Letters Patent is hereby corrected as shown below:

Column 9, Line 46

Delete: "an spaced"

Insert: -- and spaced --

Column 9, Line 47

Delete: "maid"

Insert: -- said --

Signed and Sealed this

Thirtieth Day of January, 2007

JON W. DUDAS
*Director of the United States Patent and Trademark Office*